(12) United States Patent
Choi et al.

(10) Patent No.: US 11,568,806 B2
(45) Date of Patent: Jan. 31, 2023

(54) DISPLAY DEVICE

(71) Applicant: SAMSUNG DISPLAY CO., LTD., Yongin-si (KR)

(72) Inventors: Bo Kyung Choi, Yongin-si (KR); Young Seok Kim, Yongin-si (KR); Han Na Ma, Yongin-si (KR); Sun Ho Cha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/145,883

(22) Filed: Jan. 11, 2021

(65) Prior Publication Data

US 2021/0272515 A1 Sep. 2, 2021

(30) Foreign Application Priority Data

Mar. 2, 2020 (KR) .................. 10-2020-0026208

(51) Int. Cl.
| | |
|---|---|
| *G06F 1/18* | (2006.01) |
| *G09G 3/3225* | (2016.01) |
| *H01L 25/18* | (2006.01) |
| *H04N 5/225* | (2006.01) |
| *G09G 3/3266* | (2016.01) |
| *G09G 3/3275* | (2016.01) |
| *H01L 27/32* | (2006.01) |

(52) U.S. Cl.
CPC .......... *G09G 3/3225* (2013.01); *G06F 1/189* (2013.01); *G09G 3/3266* (2013.01); *G09G 3/3275* (2013.01); *H01L 25/18* (2013.01); *H04N 5/2257* (2013.01); *G09G 2310/08* (2013.01); *G09G 2330/027* (2013.01); *H01L 27/3272* (2013.01)

(58) Field of Classification Search
CPC .. G09G 3/3225; G09G 3/3266; G09G 3/3275; G09G 2310/08; G09G 2330/027; G09G 5/003; H01L 25/18; H01L 27/3272; H01L 27/3211; H04N 5/2257; G06F 1/189; G06F 3/0412; G06K 9/00; H04L 63/101; G01J 1/0403; G02F 1/13458
USPC ........................................ 345/97, 207; 726/1
See application file for complete search history.

(56) References Cited

U.S. PATENT DOCUMENTS

| | | | |
|---|---|---|---|
| 9,911,941 B2 | 3/2018 | Choi et al. | |
| 10,057,541 B2 | 8/2018 | Chung et al. | |
| 10,276,640 B2 | 4/2019 | Chung et al. | |
| 2008/0001892 A1* | 1/2008 | Kim | ............... G02F 1/13458 345/97 |

(Continued)

FOREIGN PATENT DOCUMENTS

| | | |
|---|---|---|
| JP | 200965498 A | 3/2009 |
| JP | 4257097 B2 | 4/2009 |

(Continued)

*Primary Examiner* — Abdul-Samad A Adediran
(74) *Attorney, Agent, or Firm* — Cantor Colburn LLP

(57) ABSTRACT

A display device includes a substrate including a first display area including main pixels and a second display area including auxiliary pixels and transmissive portions; a camera module under the substrate to overlap the second display area in a thickness direction and including an image sensor; a control circuit board on the substrate and including a timing controller; and a main processor which provides an image signal to the timing controller. The camera module is directly connected to the control circuit board through a connection unit.

20 Claims, 8 Drawing Sheets

(56) References Cited

U.S. PATENT DOCUMENTS

| | | | | |
|---|---|---|---|---|
| 2013/0207952 | A1* | 8/2013 | Yu | G09G 5/003 |
| | | | | 345/207 |
| 2014/0123208 | A1* | 5/2014 | Plagemann | H04L 63/101 |
| | | | | 726/1 |
| 2016/0093251 | A1* | 3/2016 | Chung | G01J 1/0403 |
| | | | | 345/207 |
| 2017/0070679 | A1* | 3/2017 | Chung | H01L 27/3211 |
| 2019/0220643 | A1* | 7/2019 | Ling | G06K 9/00 |
| 2019/0326367 | A1* | 10/2019 | Jung | G06F 3/0412 |
| 2021/0149460 | A1* | 5/2021 | Hsieh | G06F 1/189 |

FOREIGN PATENT DOCUMENTS

| | | |
|---|---|---|
| KR | 1020160130042 A | 11/2016 |
| KR | 1020170029041 A | 3/2017 |
| KR | 101781533 B1 | 9/2017 |

\* cited by examiner

DISPLAY DEVICE

This application claims priority to Korean Patent Application No. 10-2020-0026208, filed on Mar. 2, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

As information society develops, the demands for display devices for displaying images are increasing in various forms. For example, such display devices are widely applied to various electronic devices such as smart phones, tablet personal computers ("PC"s), digital cameras, notebook computers, navigations, monitors, and televisions ("TV"s). The display devices may be flat panel display device such as liquid crystal display devices, field emission display devices, organic light emitting display devices, quantum dot light emitting display devices, etc.

Recently, a technique for disposing a camera or various sensors under a display panel has been developed to reduce dead space of a display device. Such a display device may include a first pixel area for displaying a general image and a second pixel area in which the camera or various sensors are located. The second pixel area may include a transmissive portion having relatively high light transmittance.

SUMMARY

In a display device, as described above, a camera or various sensors may be located under a display panel. In such a display device, when the camera or various sensors are operated while an image is displayed on the display panel, image quality of an image captured by the camera may be deteriorated or sensing sensitivity of the sensors may be reduced due to interference of light emitted from the display panel.

In addition, if the manufacturers of various modules (for example, a main board including a main processor, a display panel including a timing controller, etc.) and an operating system included in the display device are different, the specifications of the main processor or the design of the operating system may not be effectively changed to control an image output from the display panel when the camera or various sensors are operated.

Embodiments of the invention relate to a display device in which a camera located under a display panel may capture a high quality image, and a sensor located under the display panel may have high quality sensing sensitivity.

Embodiments of the invention relate to a display device in which a control signal may be transmitted from a camera module including a camera and/or a component including various sensors directly to a timing controller for controlling an image displayed on a display panel, without changing the specifications of a main processor or the design of an operating system.

According to an embodiment of the invention, a display device includes: a substrate including a first display area including main pixels and a second display area including auxiliary pixels and transmissive portions; a camera module under the substrate to overlap the second display area in a thickness direction, where the camera module includes ab image sensor; a control circuit board on the substrate, where the control circuit board includes a timing controller; and a main processor which provides an image signal to the timing controller. In such an embodiment, the camera module is directly connected to the control circuit board through a connection unit.

In an embodiment, the connection unit may be one of a printed circuit board and a flexible printed circuit board.

In an embodiment, when the image sensor is turned on, the camera module may transmit a signal for turning off the second display area to the timing controller.

In an embodiment, the camera module may further include at least one selected from a light emitting diode ("LED") indicator and a coprocessor.

In an embodiment, when the LED indicator is turned on, the camera module may transmit a signal for turning off the second display area to the timing controller.

In an embodiment, when the coprocessor is turned on, the camera module may transmit a signal for turning off the second display area to the timing controller.

In an embodiment, the coprocessor may be an image signal processor which receives and processes an image signal from the image sensor.

In an embodiment, the coprocessor may independently control an operation state of the camera module when the main processor is in a deactivated state, or control the operation state of the camera module together when the main processor is in an activated state.

In an embodiment, an area of each of the transmissive portions may be larger than an area of a light emitting region of each of the auxiliary pixels.

In an embodiment, the number of the auxiliary pixels per unit area may be smaller than the number of the main pixels per unit area.

In an embodiment, the display device may further include a flexible film located between the substrate and the control circuit board, where the flexible film includes a data driver.

In an embodiment, the data driver may provide a data signal to the main pixels and the auxiliary pixels based on a data control signal of the timing controller.

In an embodiment, the display device may further include a scan driving circuit board on the substrate. In such an embodiment, the scan driving circuit board may include a scan driving circuit which provides a scan signal to the main pixels and the auxiliary pixels based on a scan control signal of the timing controller.

According to an embodiment of the invention, a display device includes: a substrate including a first display area including main pixels and a second display area including auxiliary pixels and transmissive portions; a component under the substrate to overlap the second display area in a thickness direction, where the component includes a photo sensor; a control circuit board on the substrate, where the control circuit board includes a timing controller; and a main processor which provides an image signal to the timing controller. In an embodiment, the component is directly connected to the control circuit board through a connection unit.

In an embodiment, the connection unit may be one of a printed circuit board and a flexible printed circuit board.

In an embodiment, when the photo sensor is turned on, the component may transmit a signal for turning off the second display area to the timing controller.

In an embodiment, the photo sensor may use at least one selected from visible light, infrared light, and ultraviolet light.

In an embodiment, the component may transmit a signal for turning off the second display area to the timing controller when the photo sensor operates as a biometric sensor for recognizing an iris or face, and may not transmit the signal for turning off the second display area to the timing controller when the photo sensor operates as a proximity sensor.

In an embodiment, an area of each of the transmissive portions may be larger than an area of a light emitting region of each of the auxiliary pixels.

In an embodiment, the number of the auxiliary pixels per unit area may be smaller than the number of the main pixels per unit area.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
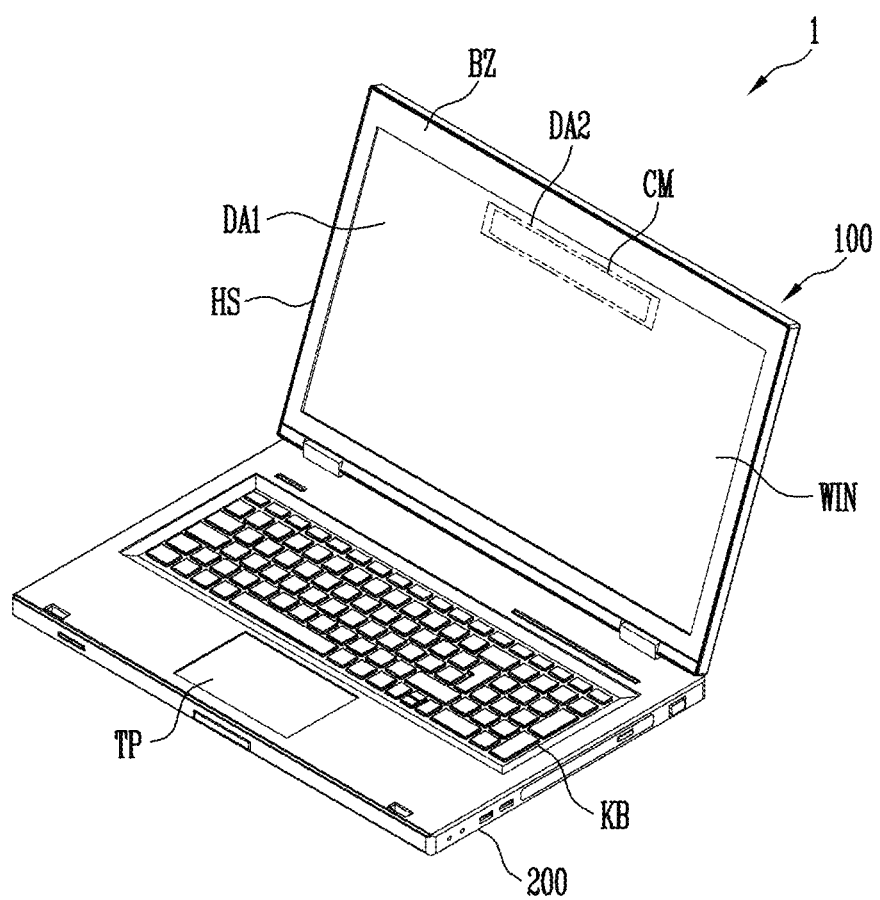
FIG. 1 is a perspective view of a display device including a camera according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view of a display device including a camera according to an embodiment of the invention.

Referring to FIG. 1, an embodiment of a display device 1 according to the invention may include a display unit 100 and a main body unit 200. The display unit 100 may be coupled to be rotatable relative to the main body unit 200. The display device 1 shown in FIG. 1 illustrates an embodiment where the display device 1 is a laptop computer, but the display device 1 is not limited thereto. The display device 1 may be any one of a smart phone, a tablet personal computer ("PC"), a mobile phone, a video phone, an e-book reader, a desktop PC, a netbook computer, a workstation, a server, a personal digital assistant ("PDA"), a portable multimedia player ("PMP"), an MP3 player, a medical device, a camera, and a head-mounted display ("HMD") device.

According to an embodiment, the display unit 100 may include a housing HS in which a window glass WIN is provided on at least a portion of a front surface. A display panel for displaying a screen through the window glass WIN may be located inside the housing HS. According to an embodiment, the display unit 100 may include a touch screen. A keyboard KB including a plurality of input keys and a touch pad TP that may replace the function of a mouse may be located on a portion of an upper surface of the main body unit 200.

According to an embodiment, an edge area of the window glass WIN on the front surface of the housing HS may be an opaque or a low transmittance bezel area BZ. According to an embodiment, the bezel area BZ may be an area to which a film of a specific color is attached.

The display panel may include a first display area DA1 including main pixels and a second display area DA2 including auxiliary pixels and transmissive portions. A camera module CM including a camera may be located under the display panel to overlap the second display area DA2. The first display area DA1, the second display area DA2, and the camera module CM will be described later in greater detail.

Figure 2:
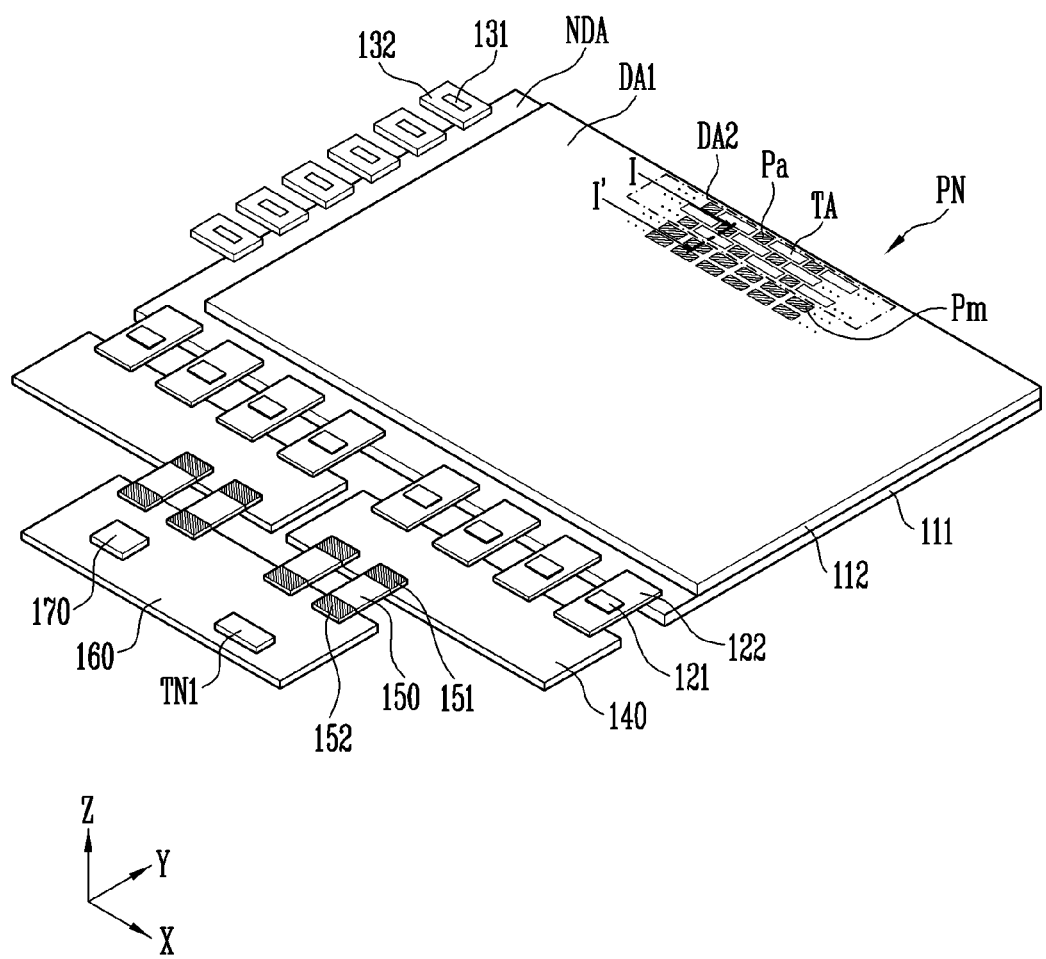
FIG. 2 is an exploded perspective view showing a display panel according to an embodiment of the invention.

FIG. 2 is an exploded perspective view showing a display panel according to an embodiment of the invention.

Referring to FIG. 2, an embodiment of a display panel PN may include a first substrate 111, a second substrate 112, data drivers 121, first flexible films 122, scan drivers 131, second flexible films 132, data circuit boards 140, first cables 150, a control circuit board 160, and a timing controller 170.

In the specification, "upper", "top", and "top surface" may refer to a direction in which the second substrate 112 is located based on the first substrate 111 of the display panel PN, that is, a third direction (Z-axis direction), and "lower", "bottom", and "bottom surface" may refer to a direction in which a heat dissipation film 130 is located based on the first substrate 111 of the display panel PN, that is, a direction opposite to the third direction (Z-axis direction). Herein, the third direction may be a thickness direction of the first substrate 11 or the second substrate 112. In addition, "left", "right", "up", and "down" may refer to directions when the display panel PN is viewed from a top plan view or a plan view in the third direction (Z-axis direction). For example, "right" may refer to a first direction (X-axis direction), "left" may refer to a direction opposite to the first direction (X-axis direction), "up" may refer to a second direction (Y-axis direction), and "low" may refer to a direction opposite to the second direction (Y-axis direction).

The display panel PN may have a rectangular shape when viewed from the top plan view. For example, the display panel PN may have a rectangular planar shape having a long side in the first direction (X-axis direction) and a short side in the second direction (Y-axis direction). A corner where the long side of the first direction (X-axis direction) and the short side of the second direction (Y-axis direction) meet may be formed at a right angle or may be rounded to have a predetermined curvature. The planar shape of the display panel PN is not limited to the rectangular shape, and may be formed in other polygon, circle or elliptical shapes.

Although the display panel PN is illustrated as being flat, the specification is not limited thereto. The display panel PN may include a curved portion that is bent at a predetermined curvature.

The display panel PN may include the first substrate 111 and the second substrate 112. The second substrate 112 may be located to face a first surface of the first substrate 111. The first substrate 111 and the second substrate 112 may be formed of rigid or flexible substrates.

The display panel PN may be an organic light emitting display panel using an organic light emitting diode including a first electrode, an organic light emitting layer, and a second electrode, an inorganic light emitting display panel using an inorganic light emitting diode including a first electrode, an inorganic semiconductor layer, and a second electrode, or a quantum dot light emitting display panel using a quantum dot light emitting diode including a first electrode, a quantum dot light emitting layer, and a second electrode.

Figure 3:
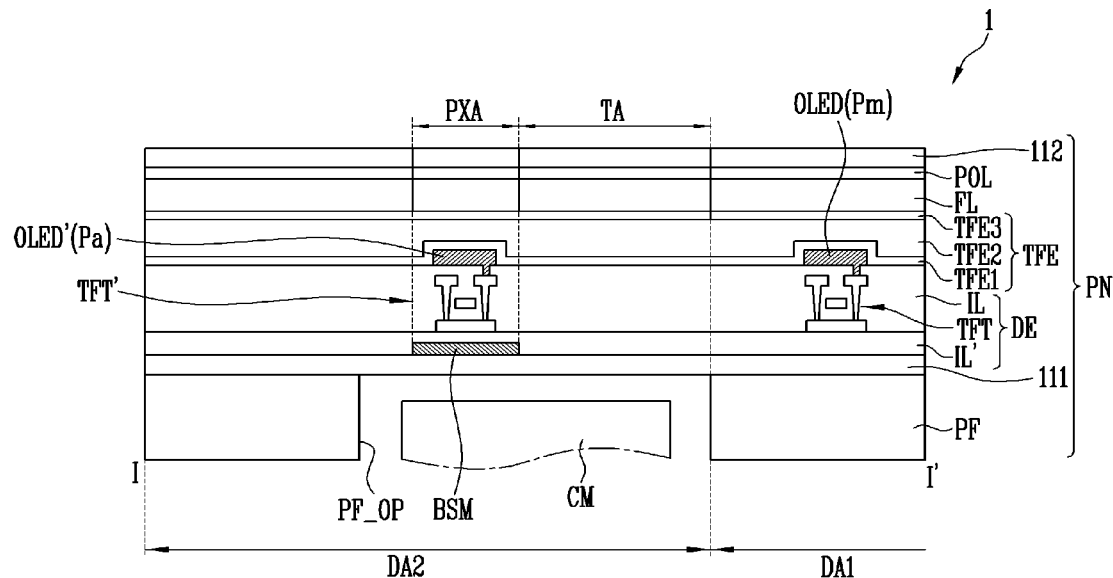
FIG. 3 is a cross-sectional view schematically showing the display device according to an embodiment of the invention, which corresponds to a cross-section taken along line I-I' of FIG. 2.

According to an embodiment of the invention, as shown in FIG. 3, the display panel PN may be the organic light emitting display panel including a display element layer DE located between the first substrate 111 and the second substrate 112, a thin film encapsulation layer TFE, a filling material FL, and a polarization layer POL. The second substrate 112 of the display panel PN may be omitted. In this case, the filling material FL may be omitted.

One side of each of the first flexible films 122 may be located on the first surface of the first substrate 111 of the display panel PN, and the other side may be attached to one surface of each of the data circuit boards 140. Specifically, since the size of the first substrate 111 is larger than that of the second substrate 112, a portion of the first substrate 111 may be exposed without being covered by the second substrate 112. The first flexible films 122 may be attached to one side of the first substrate 111 exposed without being covered by the second substrate 112. Each of the first flexible films 122 may be attached to the first surface of the first substrate 111 and one surface of each of the data circuit boards 140 using anisotropic conductive films.

Figure 6:
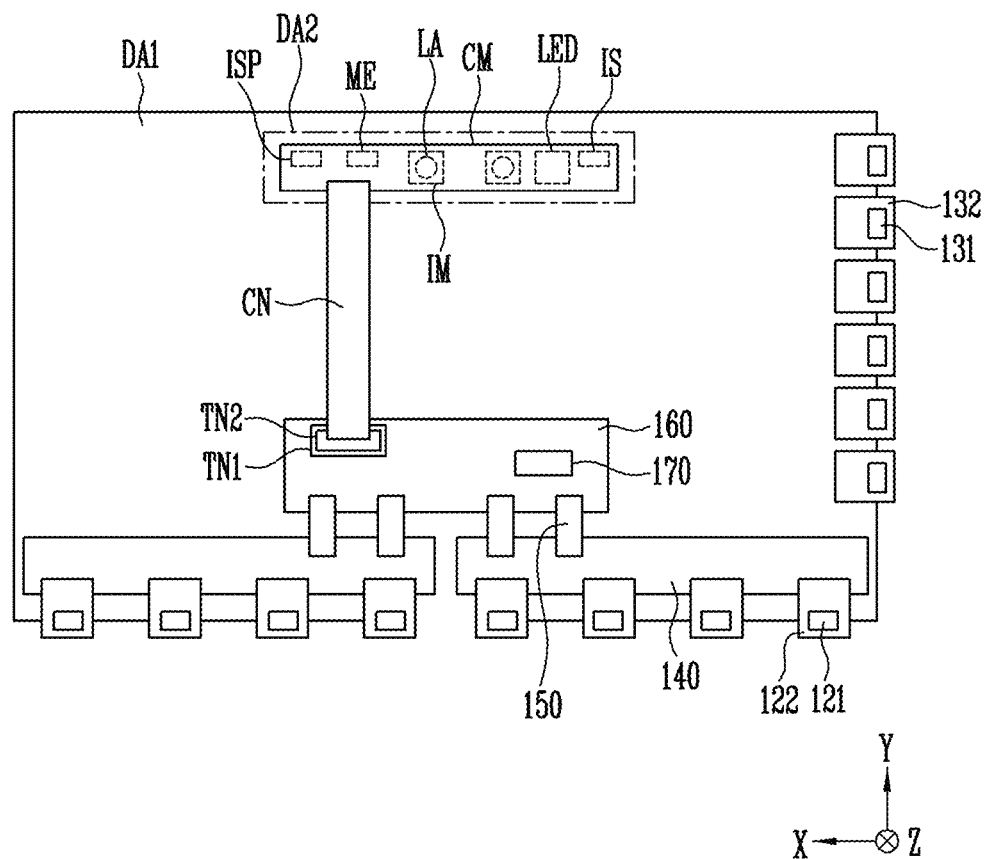
FIG. 6 is a bottom view of the display panel shown in FIG. 2 according to an embodiment of the invention.

Each of the first flexible films 122 may be a flexible film, such as a tape carrier package or a chip on film. The first flexible films 122 may be bent to a lower portion of the first substrate 111 as shown in FIG. 6. In this case, the data circuit boards 140, the first cables 150, and the control circuit board 160 may be located on a lower surface of the first substrate 111. Although FIG. 2 illustrates that eight first flexible films 122 are attached on the first substrate 111 of the display panel PN, the number of the first flexible films 122 is not limited thereto in the specification.

Each of the data drivers 121 may be located on one surface of each of the first flexible films 122. The data drivers 121 may be formed of integrated circuits (ICs). Each of the data drivers 121 may convert image signals into analog data voltages according to data control signals of the timing controller 170 and supply the analog data voltages to data lines of the display panel PN through the first flexible films 122. For example, the data control signals may include a source start pulse, a source sampling clock, a source output enable signal, and the like.

Each of the data circuit boards 140 may be connected to the control circuit board 160 through the first cables 150. Each of the data circuit boards 140 may include first connectors 151 for connection with the first cables 150. The data circuit boards 140 may be flexible printed circuit boards or printed circuit boards. The first cables 150 may be flexible cables.

The control circuit board 160 may be connected to the data circuit boards 140 through the first cables 150. To this end, the control circuit board 160 may include second connectors 152 for connection with the first cables 150. The control circuit board 160 may be a flexible printed circuit board or a printed circuit board.

Although FIG. 2 illustrates that four first cables 150 connect the data circuit boards 140 and the control circuit board 160, the number of the first cables 150 is not limited thereto in the specification. In addition, although FIG. 3 illustrates two data circuit boards 140, the number of data circuit boards 140 is not limited thereto in the specification.

Alternatively, when the number of the first flexible films 122 is small, the data circuit boards 140 may be omitted. In this case, the first flexible films 122 may be directly connected to the control circuit board 160.

The timing controller 170 may be located on one surface of the control circuit board 160. The timing controller 170 may be formed of an integrated circuit. The timing controller 170 may receive image signals and timing signals from a main processor (not shown) of a system circuit board included in the main body unit 200, and generate the data control signals to control timing of the data drivers 121 according to the timing signals.

The main processor may be mounted on the system circuit board connected to the control circuit board 160 through a flexible cable, and may be formed of an integrated circuit. The main processor may be a processor of a smart TV, a central processing unit (CPU) or a graphics card of a computer or notebook computer, or an application processor of a smartphone or tablet PC. The system circuit board may be a flexible printed circuit board or a printed circuit board.

One side of each of the second flexible films 132 may be attached on the first surface of the first substrate 111 of the display panel PN. Each of the second flexible films 132 may be attached on the first surface of the first substrate 111 using an anisotropic conductive film.

Each of the second flexible films 132 may be a flexible film, such as a tape carrier package or a chip on film. The second flexible films 132 may be bent to the lower portion of the first substrate 111 as shown in FIG. 6. Although FIG. 2 illustrates that six second flexible films 132 are attached to the first substrate 111 of the display panel PN, the number of the second flexible films 132 is not limited thereto in the specification.

Each of the scan drivers 131 may be located on one surface of each of the second flexible films 132. The scan drivers 131 may be formed of integrated circuits (ICs). Each of the scan drivers 131 may sequentially provide scan signals to a plurality of scan lines of the display panel PN according to a gate control signal of the timing controller 170 to sequentially drive the plurality of scan lines. For example, the gate control signal may include a gate start pulse, a gate shift clock, a gate output enable signal, and the like.

A power supply circuit may be additionally located on one surface of the control circuit board 160. The power supply circuit may generate voltages required for driving the display panel PN from a main power source applied from the system circuit board and supply the voltages to the display panel PN. For example, the power supply circuit may generate a high potential voltage, a low potential voltage, and an initialization voltage for driving an organic light emitting element and supply the voltages to the display panel PN. In addition, the power supply circuit may generate driving voltages for driving the data drivers 121, the timing controller 170, and the like. The power supply circuit may be formed of an integrated circuit. Alternatively, the power supply circuit may be located on a power circuit board formed separately from the control circuit board 160. The power circuit board may be a flexible printed circuit board or a printed circuit board.

Meanwhile, FIG. 2 illustrates that the display device 1 according to an embodiment is a medium-to-large display device including a plurality of data drivers 121, but the invention is not limited thereto. That is, the display device 1 according to an embodiment may be a small display device including one data driver 121. In this case, the first flexible films 122, the data circuit boards 140, and the first cables 150 may be omitted. In addition, the data drivers 121 and the timing controller 170 may be integrated into one integrated circuit and attached to one flexible circuit board or attached to the first substrate 111 of the display panel PN. Examples of the medium-to-large display device may include a monitor and a TV, and examples of the small display device may include a smart phone and a tablet PC.

The display panel PN may include display areas DA1 and DA2 and a non-display area NDA. According to an embodiment of the invention, the display areas DA1 and DA2 may include a first display area DA1 including main pixels Pm and a second display area DA2 including auxiliary pixels Pa and transmissive portions TA.

An image may be displayed using light emitted from the plurality of main pixels Pm located in the first display area DA1.

The second display area DA2 may be an area in which a camera module including an image sensor using infrared light, visible light, or the like is located below. The second display area DA2 may include transmissive portions TA through which light incident on the camera module is transmitted.

The second display area DA2 may include the auxiliary pixels Pa, and may provide a predetermined image using light emitted from the plurality of auxiliary pixels Pa. The image provided in the second display area DA2 may be an auxiliary image and may have a lower resolution than the image provided in the first display area DA1. In such an embodiment, since the second display area DA2 includes the transmissive portions TA having high light transmittance, the number of auxiliary pixels Pa located per unit area may be less than the number of main pixels Pm located per unit area in the first display area DA1. In such an embodiment, an area of one transmissive portion TA may be larger than an area of a light emitting area (or pixel region) PXA of one auxiliary pixel Pa.

The second display area DA2 may be located in a portion of the first display area DA1. In an embodiment, the second display area DA2 may be located in a portion of an upper central portion of the first display area DA1. However, the area and location of the second display area DA2 are not limited thereto, and may be variously changed according to the design of the display device.

FIG. 3 is a cross-sectional view schematically showing the display device according to an embodiment of the invention, which corresponds to a cross-section taken along line I-I' of FIG. 2.

Referring to FIG. 3, an embodiment of the display device 1 may include the display panel PN and the camera module CM. The display panel PN may include the display element layer DE, and the camera module CM may be located to correspond to the second display area DA2.

The display panel PN may include the first substrate 111, the display element layer DE located on the first substrate 111, the thin film encapsulation layer TFE on the display element DE as a sealing member for sealing the display element layer DE, the second substrate 112, and the filling material FL interposed between the thin film encapsulation layer TFE and the second substrate 112. In an embodiment, the display panel PN may further include a lower protective film PF located under the first substrate 111.

The first substrate 111 may include or be formed of a glass or a plastic. The second substrate 112 may include or be formed of a glass, a plastic, an encapsulation film, or a barrier film. Alternatively, the second substrate 112 may be omitted. In an embodiment, where the first substrate 111 and the second substrate 112 are formed of plastic, the first substrate 111 and the second substrate 112 may include polyethersulphone ("PES"), polyacrylate ("PA"), polyarylate ("PAR"), polyetherimide ("PEI"), polyethylenenaphtalate ("PEN"), polyethylene terephthalate ("PET"), polyphenylenesulfide ("PPS"), polyallylate, polyimide ("PI"), poly polycarbonate ("PC"), cellulose triacetate ("CAT"), cellulose acetate propionate ("CAP"), or a combination thereof. The encapsulation film or barrier film may be a film in which a plurality of inorganic films are stacked one on another.

The display element layer DE may include a circuit layer including thin film transistors TFT and TFT', an organic light emitting diode OLED as a display element, and insulating layers IL and IL' interposed therebetween.

A main pixel Pm including a main thin film transistor TFT and an organic light emitting diode OLED connected thereto may be located in the first display area DA1, and an auxiliary pixel Pa including an auxiliary thin film transistor TFT' and an organic light emitting diode OLED' connected thereto may be located in the second display area DA2.

In an embodiment, a transmissive portion TA in which the auxiliary thin film transistor TFT' and the display element are not located may be located in the second display area DA2. The transmissive portion TA may be understood as an area or region through which light incident on the camera module CM is transmitted.

The camera module CM may be positioned to correspond to the second display area DA2. The camera module CM will be described later in detail with reference to FIG. 5.

A lower metal layer BSM may be located in the second display area DA2. The lower metal layer BSM may be located to correspond to a lower portion of the auxiliary thin film transistor TFT'. The lower metal layer BSM may block external light from reaching the auxiliary pixel Pa including the auxiliary thin film transistor TFT' and the like. In one embodiment, for example, the lower metal layer BSM may block light emitted from an LED indicator of the camera module CM, which will be described later, from reaching the auxiliary pixel Pa.

In an embodiment, a constant voltage or signal may be applied to the lower metal layer BSM to prevent damage to a pixel circuit due to electrostatic discharge.

The thin film encapsulation layer TFE may include an inorganic encapsulation layer and an organic encapsulation layer. In one embodiment, for example, the thin film encapsulation layer TFE may include first and second inorganic encapsulation layers TFE1 and TFE3 and an organic encapsulation layer TFE2 interposed therebetween.

The first and second inorganic encapsulation layers TFE1 and TFE3 may include at least one inorganic insulating material selected from aluminum oxide, titanium oxide, tartalum oxide, hafnium oxide, zinc oxide, silicon oxide, silicon nitride, and silicon oxynitride. The organic encapsulation layer TFE2 may include a polymer-based material. The polymer-based material may include at least one selected from acrylic resin, epoxy resin, PI, polyethylene, and the like.

The lower protective film PF may be attached to the lower portion of the first substrate 111 to support and protect the first substrate 111. An opening PF_OP may be defined through the lower protective film PF in the second display area DA2. By providing the opening PF_OP in the lower protective film PF, light transmittance of the second display area DA2 may be improved. The lower protective film PF may include PET or PI.

An area of the second display area DA2 may be larger than an area where the camera module CM is located. Accordingly, an area of the opening PF_OP provided in the lower protective film PF may not match the area of the second display area DA2. In one embodiment, for example, the area of the opening PF_OP may be smaller than the area of the second display area DA2.

Although not shown in the drawings, components such as an input sensing member for sensing a touch input, an anti-reflection member including a color filter and a black matrix, and a transparent window may be further located on the display panel PN.

In an embodiment, the thin film encapsulation layer TFE is used as the sealing member for sealing the display element layer DE, but the invention is not limited thereto. In one embodiment, for example, an encapsulation substrate bonded to the first substrate 111 by a sealant or frit may be used as the sealing member for sealing the display element layer DE.

Figure 4:
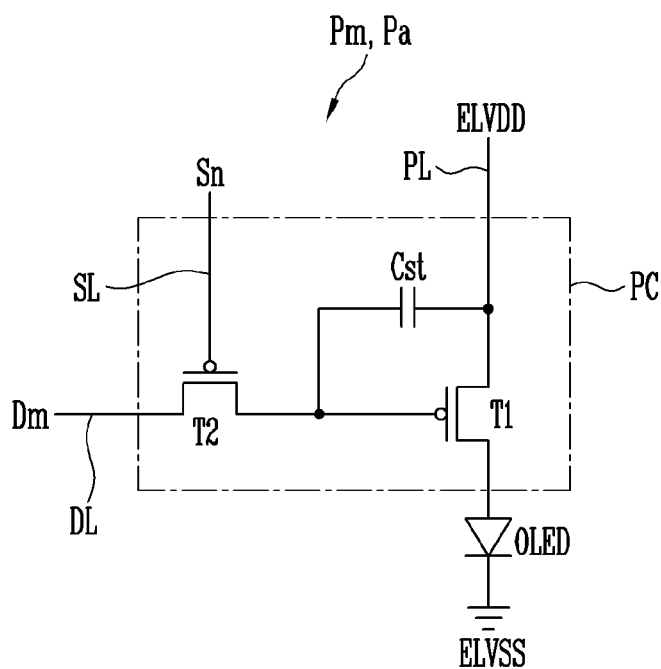
FIG. 4 is an equivalent circuit diagram of a main pixel and/or an auxiliary pixel in the display panel according to an embodiment of the invention.

FIG. 4 is an equivalent circuit diagram of a main pixel and/or an auxiliary pixel in the display panel according to an embodiment of the invention.

Referring to FIG. 4, in an embodiment, each pixel Pm and Pa may include a pixel circuit PC connected to a scan line SL and a data line DL and an organic light emitting element OLED connected to the pixel circuit PC.

The pixel circuit PC may include a driving thin film transistor T1, a switching thin film transistor T2, and a storage capacitor Cst. The switching thin film transistor T2 may be connected to the scan line SL and the data line DL, and transfer a data signal Dm input through the data line DL to the driving thin film transistor T1 in response to a scan signal Sn input through the scan line SL.

The storage capacitor Cst may be connected to the switching thin film transistor T2 and a driving voltage line PL, and store a voltage corresponding to the difference between a voltage received from the switching thin film transistor T2 and a first power source voltage ELVDD (or driving voltage) supplied to the driving voltage line PL.

The driving thin film transistor T1 may be connected to the driving voltage line PL and the storage capacitor Cst, and control a driving current flowing through the organic light emitting element OLED from the driving voltage line PL in response to a voltage value stored in the storage capacitor Cst. The organic light emitting element OLED may emit light having a predetermined luminance in response to the driving current. The organic light emitting element OLED may be further connected to a second power source voltage ELVSS.

FIG. 4 shows an embodiment where the pixel circuit PC includes two thin film transistors and a single storage capacitor, but the invention is not limited thereto. Alternatively, the pixel circuit PC may further include more thin film transistors and capacitors.

Figure 5:
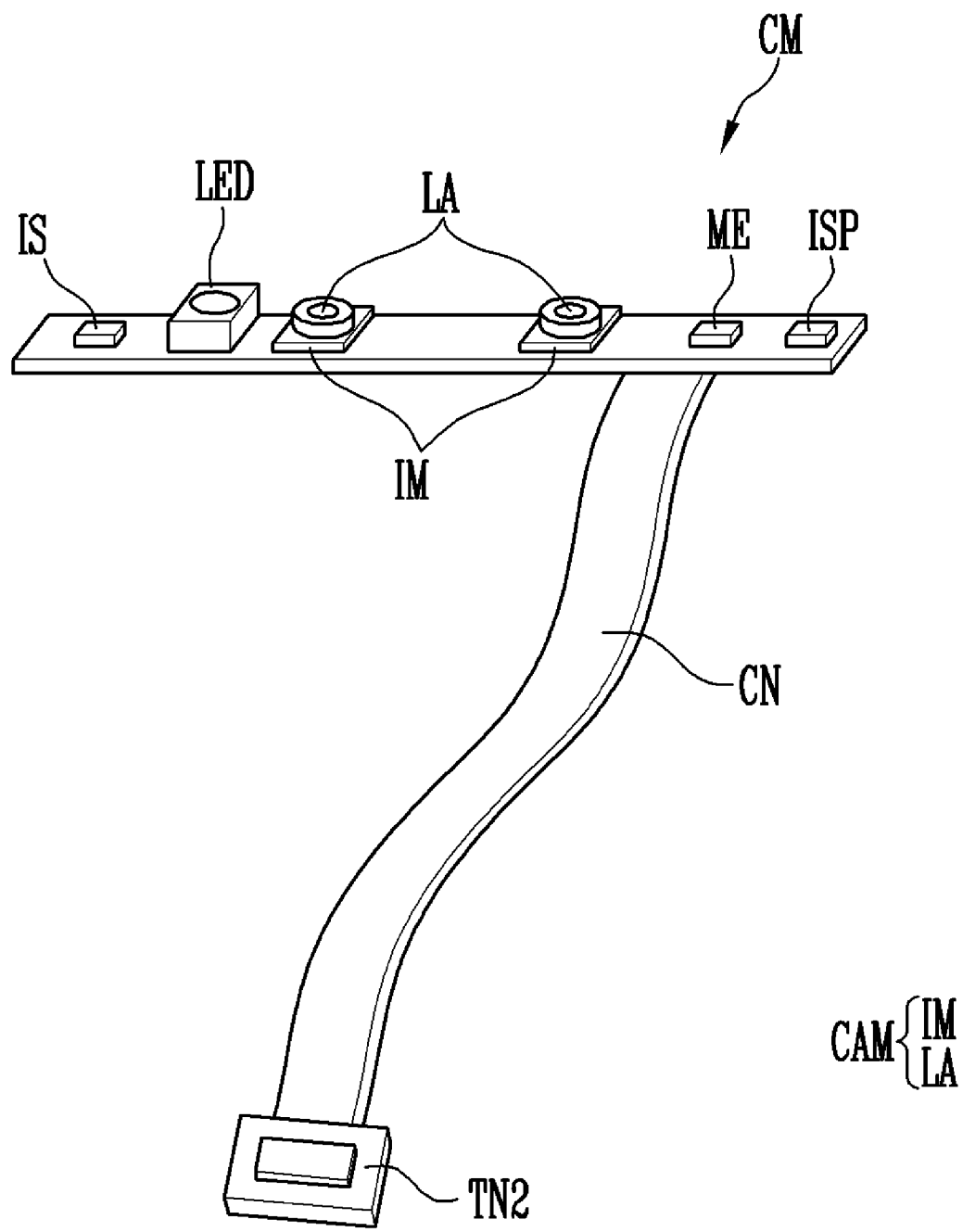
FIG. 5 is a perspective view of a camera module according to an embodiment of the invention.

FIG. 5 is a perspective view of a camera module according to an embodiment of the invention. FIG. 6 is a bottom view of the display panel shown in FIG. 2 according to an embodiment of the invention.

Referring to FIGS. 1, 5 and 6, an embodiment of the camera module CM may be located under the display panel PN to overlap the second display area DA2 in the thickness direction (for example, Z-axis direction).

According to an embodiment of the invention, the camera module CM may include an camera CAM including a lens assembly LA and an image sensor IM, a light emitting diode ("LED") indicator LED, an image stabilizer IS, and a memory ME (for example, a buffer memory), and an image signal processor ISP.

The lens assembly LA may collect light emitted from a subject that is an object of image capture. The lens assembly LA may include one or more lenses. According to an embodiment, the camera module CM may include a plurality of lens assemblies LA. In such an embodiment, the camera module CM may form, for example, a dual camera, a 360-degree camera, or a spherical camera. Some of the plurality of lens assemblies LA may have a same lens properties (for example, angle of view, focal length, auto-focus, f number, or optical zoom) as each other. In an alternative embodiment, at least one lens assembly may have one or more lens properties different from the lens properties of the other lens assemblies. The lens assembly LA may include, for example, a wide-angle lens or a telephoto lens.

The image sensor IM may obtain an image corresponding to the subject by converting light emitted from or reflected from the subject and transferred through the lens assembly LA into an electrical signal. According to an embodiment, the image sensor IM may include, for example, at least one image sensor selected from image sensors having different properties, such as a red-green-blue ("RGB") sensor, a black and white ("BW") sensor, an infrared ("IR") sensor, or a ultraviolet ("UV") sensor, a plurality of image sensors having same properties from each other, or a plurality of image sensors having different properties from each other. Each image sensor included in the image sensor IM may be implemented as, for example, a charged coupled device ("CCD") sensor or a complementary metal oxide semiconductor ("CMOS") sensor.

The LED indicator LED may emit light for informing a user of a display device 1 that the camera CAM is in operation. According to an embodiment, the LED indicator LED may include one or more LED, for example, a RGB LED, a white LED, an IR LED, or a UV LED.

The image stabilizer IS may move at least one lens or image sensor IM included in the lens assembly LA in a specific direction in response to the movement of the camera module CM or the display device 1 including the camera module CM, or control the operating characteristics of the image sensor IM (for example, adjust read-out timing, etc.) to allow at least some of negative effects caused by the movement to be compensated for the image being captured. According to an embodiment, the image stabilizer IS may detect the movement of the camera module CM or the display device 1 using a gyro sensor (not shown) or an acceleration sensor (not shown) located inside or outside the camera module CM. According to an embodiment, the image stabilizer IS may be implemented with, for example, an optical image stabilizer.

The memory ME may temporarily store at least a portion of the image acquired by the image sensor IM for the next image processing operation. In one embodiment, for example, when the acquisition of the image is delayed depending on a shutter, or when a plurality of images are acquired at a high speed, the acquired original image (for example, a Bayer-patterned image or a high resolution image) may be stored in the memory ME, and a corresponding copy image (for example, a low resolution image) may be displayed on the display device 1. Thereafter, when a predetermined condition is satisfied (for example, a user input or a system command), at least a portion of the original image stored in the memory ME may be obtained and processed, for example, by the image signal processor ISP. According to an embodiment, such an operation may be performed by at least a portion of the memory ME, or a separate memory that is independently operated.

The image signal processor ISP may perform one or more image processes on the image acquired by the image sensor IM or the image stored in the memory ME. The one or more image processes may include, for example, depth map generation, three-dimensional modeling, panorama generation, feature extraction, image synthesis, or image compensation (for example, noise reduction, resolution adjustment, brightness adjustment, blurring, sharpening, or softening). The image signal processor ISP may perform control (for example, exposure time control or lead-out timing control) for at least one of the components included in the camera module CM (for example, the image sensor IM). The image processed by the image signal processor ISP may be stored in the memory ME again for subsequent processing or provided to an external component (for example, the main body unit 200) of the camera module CM. According to an embodiment, such an operation of the image signal processor ISP may be performed by a separate coprocessor that operates independently of the main processor included in the main body unit 200.

The image signal processor ISP may independently control an operation state of the camera module CM when the main processor is in a deactivated state, or control the operation state of the camera module CM together when the main processor is in an activated state.

According to an embodiment, the camera module CM may include a plurality of cameras CAM having different properties or functions from each other. In one embodiment, for example, at least one of the plurality of cameras CAM may be a wide-angle camera and at least one of the plurality of cameras CAM may be a telephoto camera.

The camera module CM may be directly connected to the control circuit board 160 of the display panel PN through a connection unit CN. According to an embodiment of the invention, the connection unit CN may be a printed circuit board or a flexible printed circuit board. FIG. 5 shows an embodiment where the connection unit CN is the flexible printed circuit board. The flexible printed circuit board of the connection unit CN may include signal lines for transmitting operation states of the image sensor IM, the LED indicator LED, the image stabilizer IS, and the image signal processor ISP.

The connection unit CN may include a second terminal TN2 provided at one end thereof. The second terminal TN2 may be connected to a first terminal TN1 of the control circuit board 160 of the display panel PN. In such an embodiment, various signals generated from the camera module CM may be directly transmitted to the timing controller 170 of the display panel PN without passing through the main processor included in the main body unit 200. In one embodiment, for example, the various signals generated from the camera module CM may include a turn-on signal indicating that at least one of the image sensor IM, the LED indicator LED, the image stabilizer IS, and the image signal processor ISP is operating.

Figure 7:
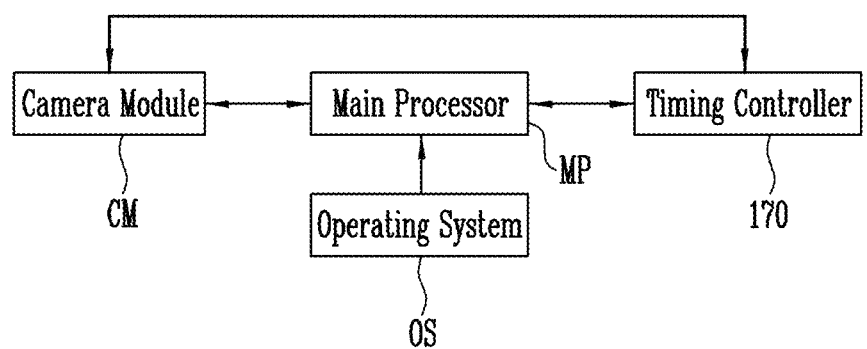
FIG. 7 is a block diagram for explaining signal flows between a display unit, a main body unit, and a camera module.
Figure 8A:
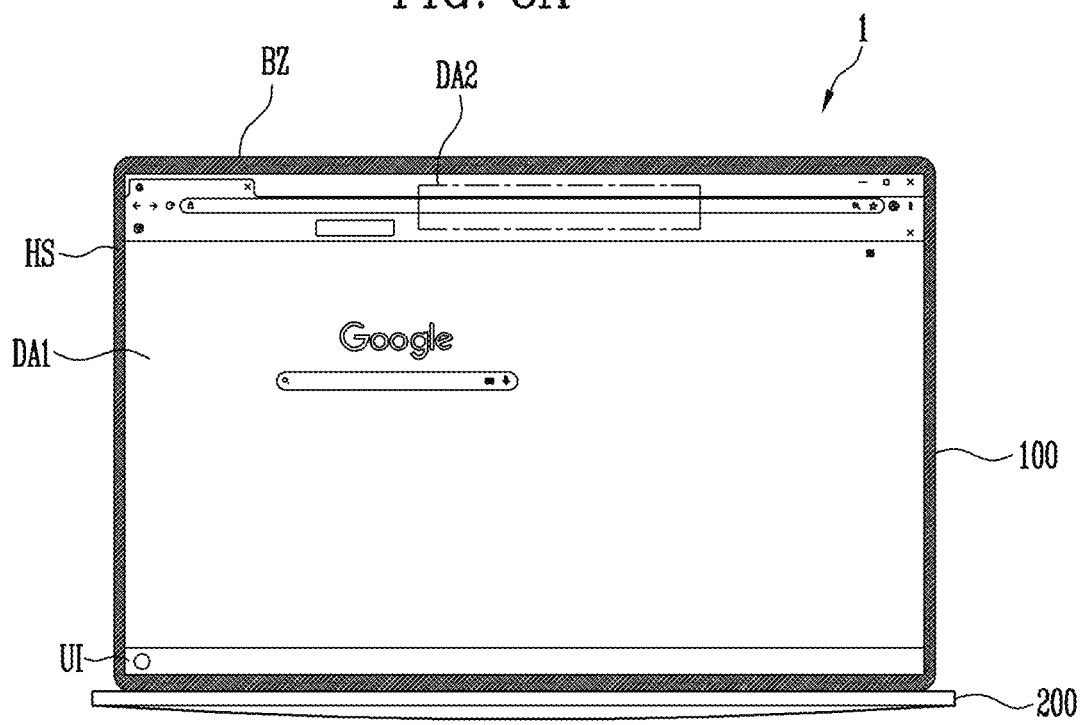
FIG. 8A is a diagram illustrating a state in which a second display area is activated when the camera module is turned off.
Figure 8B:
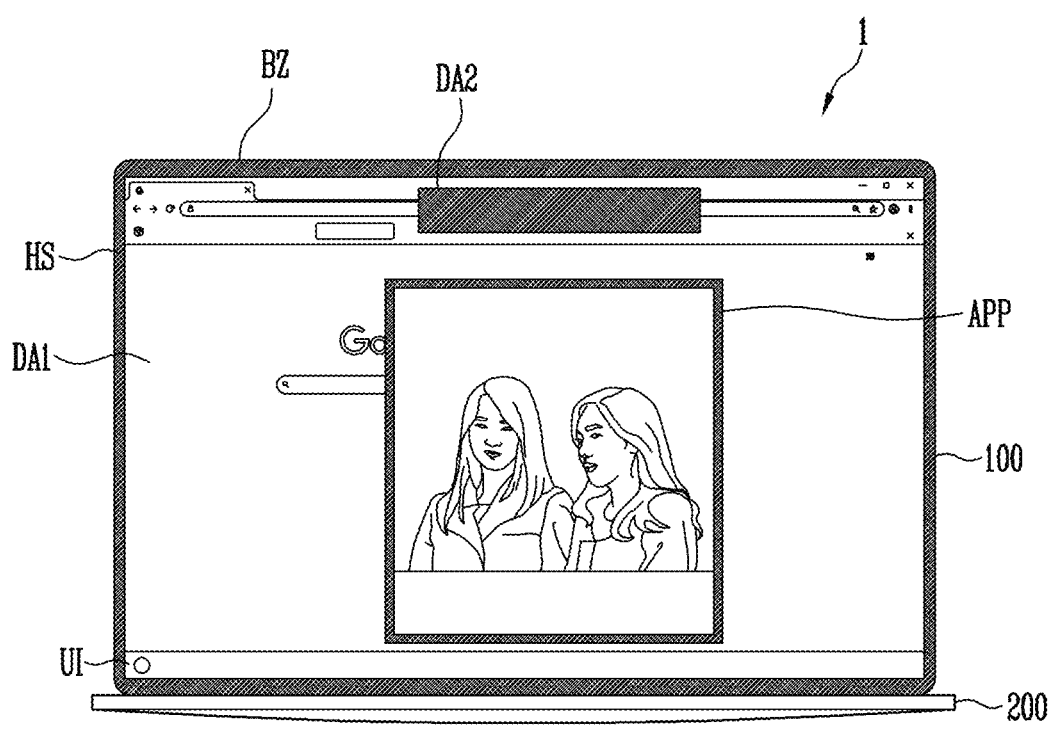
FIG. 8B is a diagram illustrating a state in which the second display area is deactivated when the camera module is turned off.

FIG. 7 is a block diagram for explaining signal flows between a display unit, a main body unit, and a camera module. FIG. 8A is a diagram illustrating a state in which a second display area is activated when the camera module is turned off. FIG. 8B is a diagram illustrating a state in which the second display area is deactivated when the camera module is turned off.

Referring to FIGS. 1, 2, 6, 7, 8A and 8B, in an embodiment, when at least one of the image sensor IM, the LED indicator LED, the image stabilizer IS, and the image signal processor ISP is operated, the camera module CM may transmit a signal for turning off the second display area DA2 to the timing controller 170. In such an embodiment, the turn-off state of the second display area DA2 may mean a state in which the auxiliary pixel Pa included in the second display area DA2 does not emit light.

As shown in FIG. 8A, when the display device 1 is in a turn-on state, the display unit 100 may display a user interface UI capable of operating an operating system OS. In an embodiment, the operating system OS may include, for example, Android®, iOS©, Windows®, Symbian®, Tizen®, or Bada®.

In such an embodiment, the main processor MP may provide the image signals and the timing signals to the timing controller 170 to display the user interface UI on the display unit 100.

The scan signals may be sequentially supplied to the plurality of scan lines of the display panel PN in response to the gate control signal of the timing controller 170 to sequentially drive the plurality of scan lines.

In such an embodiment, the timing controller 170 may generate the data control signals for controlling the timing of the data drivers 121. Each of the data drivers 121 may convert the image signals into the analog data voltages based on the data control signals of the timing controller 170 and supply the analog data voltages to the data lines of the display panel PN through the first flexible films 122.

In an embodiment, the user may input a command for initiating an operation of the camera module CM through the user interface UI of the operating system OS. In one embodiment, For example, when the user inputs a command to execute a camera application APP and a video call application, the operation of the camera module CM may be initiated. In this case, the main processor MP of the main body unit 200 may transmit a control signal for turning on the camera module CM to the camera module CM.

In an embodiment, as shown in FIG. 8B, when at least one image sensor IM is turned on, the camera module CM may transmit the signal for turning off the second display area DA2 to the timing controller 170. When the second display area DA2 is turned off, the second display area DA2 may stop displaying an image.

In such an embodiment, when the image sensor IM is operated, the phenomenon that light emitted from the auxiliary pixel Pa is reflected from the thin film encapsulation layer TFE, the filling material FL, and the second substrate 112 and then incident on the image sensor IM may be effectively prevented, and thus, a high quality image may be obtained.

In such an embodiment, since the signal for turning off the second display area DA2 is directly transmitted from the camera module CM to the timing controller 170 without passing through the main processor MP, the timing controller 170 may independently perform an operation for turning off the display of the second display area DA2 when the camera module CM is operated, without changing the specifications of the main processor MP or the design of the operating system.

The condition in which the camera module CM transmits the signal for turning off the second display area DA2 to the timing controller 170 is not limited to when the image sensor IM is turned on. In one embodiment, for example, when the LED indicator LED is turned on, the camera module CM may transmit the signal for turning off the second display area DA2 to the timing controller 170. When the image signal processor ISP is turned on, the camera module CM may transmit the signal for turning off the second display area DA2 to the timing controller 170. In such an embodiment, when the image stabilizer IS is turned on, the camera module CM may transmit the signal for turning off the second display area DA2 to the timing controller 170.

Hereinafter, alternative embodiments will be described. In the following embodiments, the same elements or configurations as those of the above-described embodiments will be omitted or simplified, and the differences will be mainly described.

Figure 9:
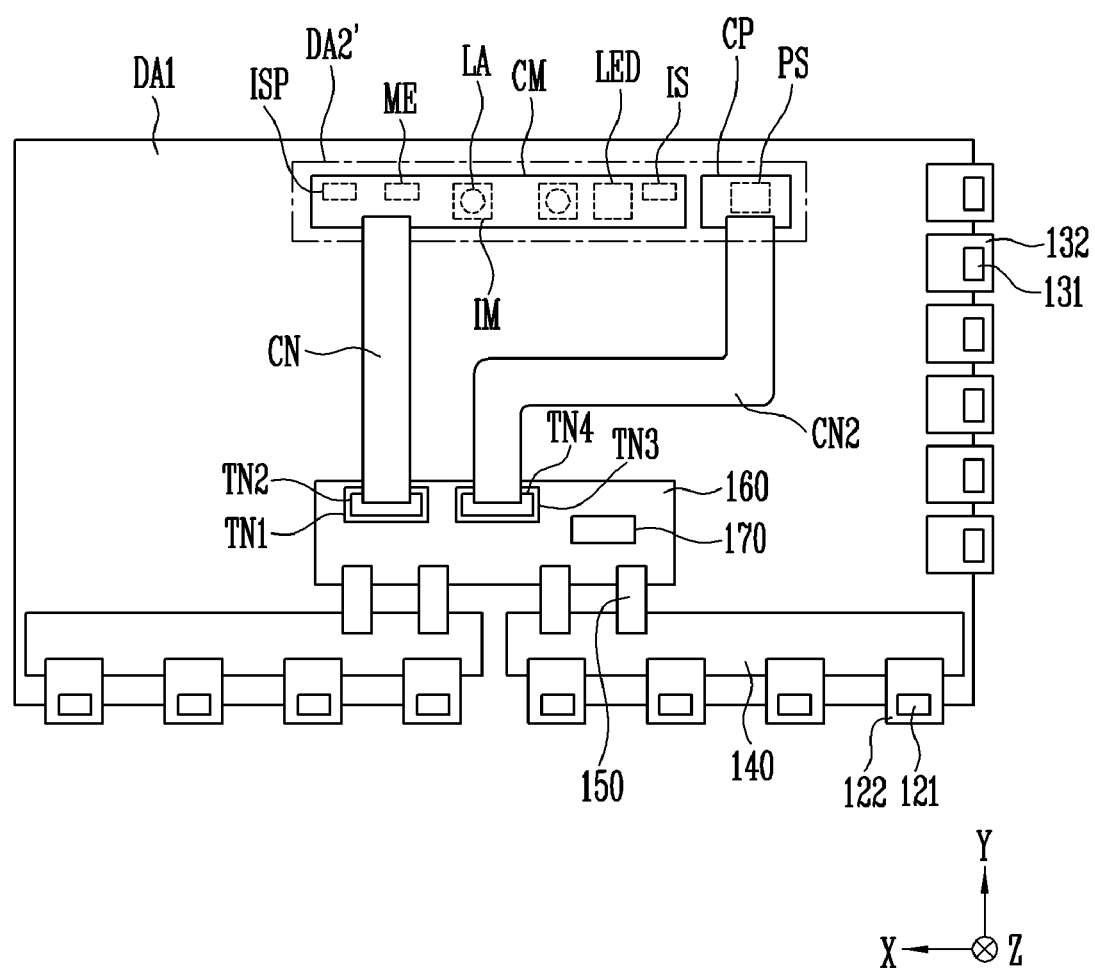
FIG. 9 is a bottom view of the display panel shown in FIG. 2 according to an alternative embodiment of the invention.
Figure 10:
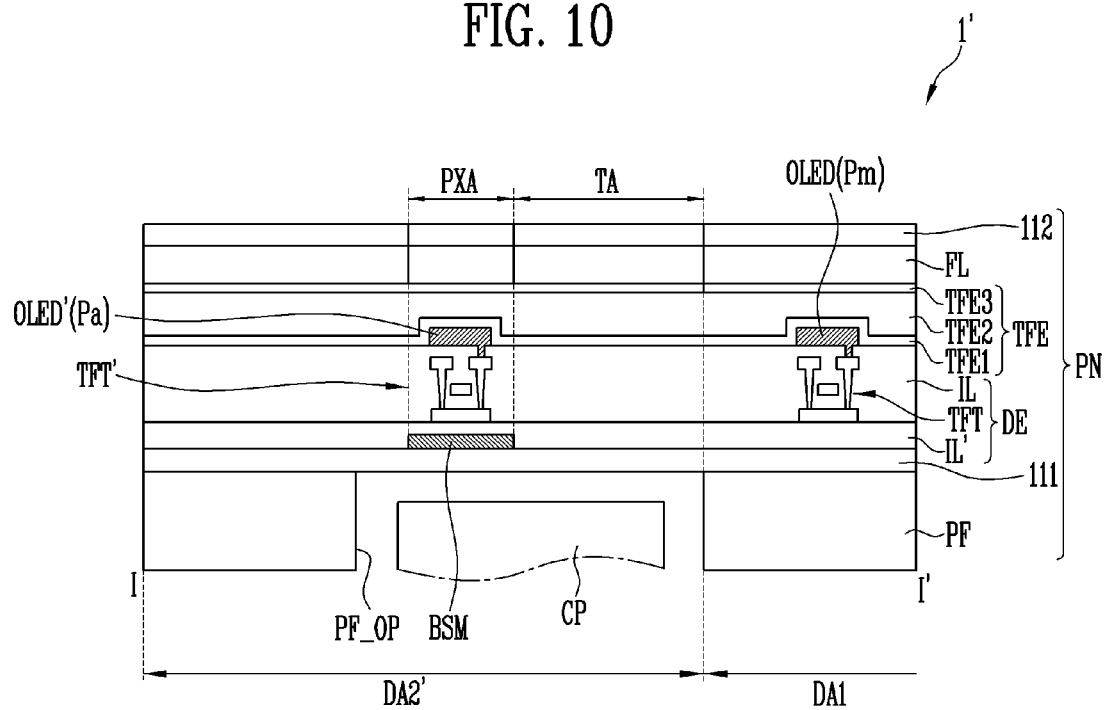
FIG. 10 is a cross-sectional view schematically showing a display device according to an alternative embodiment of the invention, which corresponds to a cross-section taken along line I-I' of FIG. 2.
Figure 11:
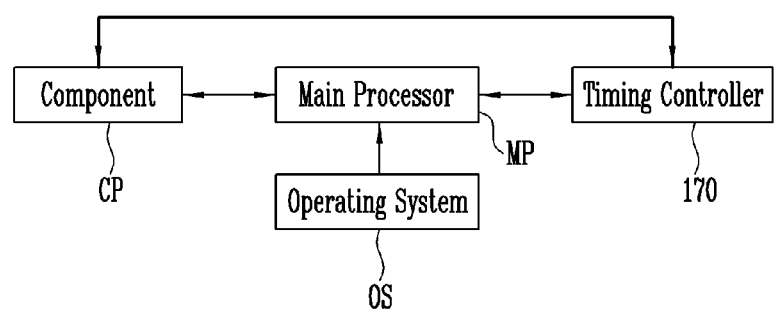
FIG. 11 is a block diagram for explaining signal flows between a display unit, a main body unit, and a component.

FIG. 9 is a bottom view of the display panel shown in FIG. 2 according to an alternative embodiment of the invention. FIG. 10 is a cross-sectional view schematically showing a display device according to an alternative embodiment of the invention, which corresponds to a cross-section taken along line I-I' of FIG. 2. FIG. 11 is a block diagram for explaining signal flows between a display unit, a main body unit, and a component.

Referring to FIGS. 9, 10 and 11, in an alternative embodiment, a display device 1' may include a second display area DA2' having an area larger than that of the second display area DA2 shown in FIG. 6, and a component CP may be further located under the display panel PN to overlap the display area DA2'. FIG. 9 shows an embodiment in which both the camera module CM and the component CP are located under the display panel PN. In an alternative embodiment, only the component CP may be located under the display panel PN. For convenience of description, any repetitive detailed description of the camera module CM will be omitted. Hereinafter, a configuration related to the component CP will be described Referring to FIGS. 2, 9, 10 and 11, an embodiment of the display device 1' may include the display panel PN and the component CP. The display panel PN may include the display element layer DE, and the component CP may be located in the second display area DA2'.

The main pixel Pm including the main thin film transistor TFT and the organic light emitting diode OLED connected thereto may be located in the first display area DA1, and the auxiliary pixel Pa including the auxiliary thin film transistor TFT' and the organic light emitting diode OLED' connected thereto may be located in the second display area DA2.

In such an embodiment, the transmissive portion TA, in which the auxiliary thin film transistor TFT' and the display element are not located, may be located in the second display area DA2'. The transmissive portion TA may be understood as an area or region through which light or a signal emitted from the component CP or incident on the component CP is transmitted.

The component CP may be positioned in the second display area DA2'. FIG. 9 shows one second display area DA2' including both the camera module CM and the component CP, but the invention is not limited thereto. In an alternative embodiment, the second display area DA2' may include or be formed of two separate areas, which are spaced apart from each other. In such an embodiment, the camera module CM and the component CP may be located to correspond to the separated second display areas DA2', respectively.

The component CP may be an electronic element using light or sound. In one embodiment, For example, the component CP may be a sensor that receives and uses light such as an infrared sensor, a sensor that outputs and senses light or sound to measure a distance or recognize a fingerprint, a small lamp that outputs light, a speaker that outputs sound, or the like. In an embodiment, where the component OP is an electronic element using light, light of various wavelength bands such as visible light, infrared light, and ultraviolet light may be used. The number of components CP located in the second display area DA2' may be provided in plural. In one embodiment, for example, as the component CP, a light emitting element and a light receiving element may be provided together in one second display area DA2'. Alternatively, the light emitting unit and the light receiving unit may be simultaneously provided in a single component CP.

The area of the second display area DA2' may be larger than that of an area where the component CP is located. Accordingly, the area of the opening PF_OP provided in the lower protective film PF may not match the area of the second display area DA2'. In one embodiment, for example, the area of the opening PF_OP may be smaller than the area of the second display area DA2'.

In an embodiment, a plurality of components CP may be located in the second display area DA2'. The plurality of components CP may have different functions from each other.

According to an embodiment of the invention, the component CP may be a photo sensor PS. The component CP may be directly connected to the control circuit board 160 of the display panel PN through a connection unit CN2. According to an embodiment of the invention, the connection unit CN2 may be one of a printed circuit board and a flexible printed circuit board. The flexible printed circuit board of the connection unit CN2 may include signal lines for transmitting an operating state of the photo sensor PS.

The connection unit CN2 may include a fourth terminal TN4 provided at one end thereof. The fourth terminal TN4 may be connected to a third terminal TN3 of the control circuit board 160 of the display panel PN. Accordingly, various signals generated from the component CP may be directly transmitted to the timing controller 170 of the display panel PN without passing through the main processor MP included in the main body unit 200. For example, the various signals generated from the component CP may include a turn-on signal indicating that the photo sensor PS is operating.

When the photo sensor PS is operated, the component CP may transmit a signal for turning off the second display area DA2' to the timing controller 170. In such an embodiment, the turn-off state of the second display area DA2' may mean a state in which the auxiliary pixel Pa included in the second display area DA2 does not emit light.

When the display device 1' is in a turn-on state, the display unit 100 may display the user interface UI capable of operating the operating system OS. In such an embodiment, the operating system OS may include, for example, Android®, iOS®, Windows®, Symbian®, Tizen®, or Bada®.

In such an embodiment, the main processor MP may provide the image signals and timing signals to the timing controller 170 to display the user interface UI on the display unit 100.

The scan signals may be sequentially supplied to the plurality of scan lines of the display panel PN in response to the gate control signal of the timing controller 170 to sequentially drive the plurality of scan lines.

In an embodiment, the timing controller 170 may generate the data control signals for controlling the timing of the data drivers 121. Each of the data drivers 121 may convert the image signals into the analog data voltages based on the data control signals of the timing controller 170 and supply the analog data voltages to the data lines of the display panel PN through the first flexible films 122.

Meanwhile, the operating system OS may initiate the operation of the photo sensor PS when a predetermined condition is satisfied. For example, when the user takes a gesture such as moving a hand from left to right in a region close to the photo sensor PS, the photo sensor PS may operate as a proximity sensor. Alternatively, in a locked state in which the display device 1' displays a lock mode screen on the display unit 100 for personal security, when the user looks at the display unit 100 for a predetermined time, the photo sensor PS may operate as a biometric sensor for recognizing the user's iris or face. In this case, the main processor MP of the main body unit 200 may transmit a control signal for turning on the photo sensor PS to the component CP.

FIG. 9 shows an embodiment including a single photo sensor PS, and the single photo sensor PS may perform a plurality of functions, but the invention is not limited thereto. Alternatively, a plurality of photo sensors PS may be provided, and the photo sensors PS may have different functions from each other.

In general, a light transmittance of about 15% may be desired to utilize the photo sensor as the proximity sensor, and a light transmittance of about 85% may be desired to recognize an iris or face.

In an embodiment, when the photo sensor PS is turned on and operates as the biometric sensor, the component CP may transmit the signal for turning off the second display area DA2' to the timing controller 170. When the second display area DA2' is turned off, the second display area DA2' may no longer display an image.

In such an embodiment, when the photo sensor PS is turned on and operates as the proximity sensor, the component CP may not transmit the signal for turning off the second display area DA2' to the timing controller 170. When the second display area DA2' maintains a turn-on state, the second display area DA2' may continuously display an image.

In such an embodiment, when the photo sensor PS is operated as the biometric sensor, the phenomenon that light emitted from the auxiliary pixel Pa is reflected from the thin film encapsulation layer TFE, the filling material FL, and the second substrate 112 and then incident on the image sensor IM may be prevented, and thus, high quality sensing sensitivity can be secured.

In such an embodiment, since the signal for turning off the second display area DA2' is directly transmitted from the component CP to the timing controller 170 without passing through the main processor MP, the timing controller 170 may independently perform an operation for turning off the display of the second display area DA2' when the photo sensor PS is operated, without changing the specifications of the main processor MP or the design of the operating system.

In such an embodiment, when the photo sensor PS is operated as the proximity sensor, since the second display area DA2' continuously displays the image, inconvenience may be minimized when the user views the image.

In embodiments of the display device according to the invention, the pixels of the display panel may be turned off when the camera and/or sensor is operated. Therefore, a high quality image may be captured through the camera and the sensor can have high quality sensing sensitivity.

In embodiments of the display device according to the invention, the camera module and/or component may be directly connected to the control circuit board including the timing controller through the connection unit. Therefore, the camera and/or various sensors may directly transmit the control signal to the timing controller that controls the image displayed on the display panel without changing the specifications of the main processor or the design of the operating system.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate comprising a first display area comprising main pixels and a second display area comprising auxiliary pixels and transmissive portions;
   a camera module under the substrate to overlap the second display area in a thickness direction, wherein the camera module comprises an image sensor;
   a control circuit board on the substrate, wherein the control circuit board comprises a timing controller; and
   a main processor which provides an image signal to the timing controller,
   wherein the camera module is directly connected to the control circuit board through a connection unit, and
   Wherein when the camera module is turned on, the camera transmits a signal for turning off the second display area directly to the timing controller.

2. The display device of claim 1, wherein the connection unit is one of a printed circuit board and a flexible printed circuit board.

3. The display device of claim 1, wherein when the image sensor is turned on, the camera module transmits the signal for turning off the second display area to the timing controller.

4. The display device of claim 1, wherein the camera module further comprises at least one selected from a light emitting diode indicator and a coprocessor.

5. The display device of claim 4, wherein when the light emitting diode indicator is turned on, the camera module transmits the signal for turning off the second display area to the timing controller.

6. The display device of claim 4, wherein when the coprocessor is turned on, the camera module transmits the signal for turning off the second display area to the timing controller.

7. The display device of claim 6, wherein the coprocessor is an image signal processor which receives and processes an image signal from the image sensor.

8. The display device of claim 4, wherein the coprocessor independently controls an operation state of the camera module when the main processor is in a deactivated state, or controls the operation state of the camera module together when the main processor is in an activated state.

9. The display device of claim 1, wherein an area of each of the transmissive portions is larger than an area of a light emitting region of each of the auxiliary pixels.

10. The display device of claim 1, wherein a number of the auxiliary pixels per unit area is smaller than a number of the main pixels per unit area.

11. The display device of claim 1, further comprising:
    a flexible film between the substrate and the control circuit board, wherein the flexible film comprises a data driver.

12. The display device of claim 11, wherein the data driver provides a data signal to the main pixels and the auxiliary pixels based on a data control signal of the timing controller.

13. The display device of claim 1, further comprising:
    a scan driving circuit board on the substrate,
    wherein the scan driving circuit board comprises a scan driving circuit which provides a scan signal to the main pixels and the auxiliary pixels based on a scan control signal of the timing controller.

14. A display device comprising:
    a substrate comprising a first display area comprising main pixels and a second display area comprising auxiliary pixels and transmissive portions;
    a component under the substrate to overlap the second display area in a thickness direction, wherein the component comprises a photo sensor;
    a control circuit board on the substrate, wherein the control circuit board comprises a timing controller; and
    a main processor which provides an image signal to the timing controller,
    wherein the component is directly connected to the control circuit board through a connection unit, and
    wherein when the component is turned on, the camera module transmits a signal for turning off the second display area directly to the timing controller.

15. The display device of claim 14, wherein the connection unit is one of a printed circuit board and a flexible printed circuit board.

16. The display device of claim 14, wherein when the photo sensor is turned on, the component transmits the signal for turning off the second display area to the timing controller.

17. The display device of claim 14, wherein the photo sensor uses at least one selected from visible light, infrared light, and ultraviolet light.

18. The display device of claim 14, wherein the component transmits a signal for turning off the second display area to the timing controller when the photo sensor operates as a biometric sensor for recognizing an iris or face, and does not transmit the signal for turning off the second display area to the timing controller when the photo sensor operates as a proximity sensor.

19. The display device of claim 14, wherein an area of each of the transmissive portions is larger than an area of a light emitting region of each of the auxiliary pixels.

20. The display device of claim 14, wherein a number of the auxiliary pixels per unit area is smaller than number of the main pixels per unit area.

* * * * *